United States Patent
Hagl et al.

[19]

[11] Patent Number: 6,043,482
[45] Date of Patent: Mar. 28, 2000

[54] SCANNING UNIT WITH A PRINTED CIRCUIT FOR AN OPTICAL POSITION-MEASURING APPARATUS

[75] Inventors: Rainer Hagl, Altenmarkt; Wolfgang Holzapfel, Obing; Hermann Hofbauer, Trostberg; Volker Höfer; Herbert Pronold, both of Traunreut, all of Germany

[73] Assignee: Johannes Heidenhain GmbH, Traunreut, Germany

[21] Appl. No.: 08/982,761

[22] Filed: Dec. 2, 1997

[30] Foreign Application Priority Data

Dec. 7, 1996 [DE] Germany ............... 196 50 832

[51] Int. Cl.⁷ .................................................. G01D 5/34
[52] U.S. Cl. .............................. 250/231.13; 250/237 G
[58] Field of Search ................... 250/231.13, 231.14, 250/231.16, 237 G, 237 R, 234, 216; 257/698, 676, 678, 680, 778

[56] References Cited

U.S. PATENT DOCUMENTS

| | | |
|---|---|---|
| 4,661,698 | 4/1987 | Cappio et al. . |
| 4,906,838 | 3/1990 | Sogabe et al. . |
| 5,486,923 | 1/1996 | Mitchell et al. . |
| 5,534,693 | 7/1996 | Kondo et al. . |
| 5,866,942 | 2/1999 | Suzuki et al. ............... 257/698 |

FOREIGN PATENT DOCUMENTS

| | | |
|---|---|---|
| 0 328 661 | 2/1989 | European Pat. Off. . |
| 0 146 312 | 2/1991 | European Pat. Off. . |
| 195 24 725 | 7/1996 | Germany . |
| 57-207819 | 12/1982 | Japan . |

OTHER PUBLICATIONS

Kober, H. et al., "Flexibel verdrahten auf kleinstem Raum," F&M, pp. 356–359, (1996).

*Primary Examiner*—Edward P. Westin
*Assistant Examiner*—Kevin Pyo
*Attorney, Agent, or Firm*—Brinks Hofer Gilson & Lione

[57] ABSTRACT

A scanning unit for an optical position-measuring apparatus with a flexible printed circuit that electrically couples several electronic components. Among the components is at least one optoelectronic detector element or a radiation source that is suitable for the generation of shift-dependent modulated optical scanning signals from the scanning of a scale graduation structure. The radiation-sensitive detector face or the light-emitting face of the radiation source is oriented in the direction towards the flexible printed circuit. The flexible printed circuit has at least partially transparent recesses at least in a partial area of the radiation-sensitive detector face or the light-emitting face of the radiation source, a scanning graduation or transmitting graduation is disposed that in cooperation with the scale graduation structure makes possible the generation of position-dependent modulated scanning signals.

30 Claims, 6 Drawing Sheets

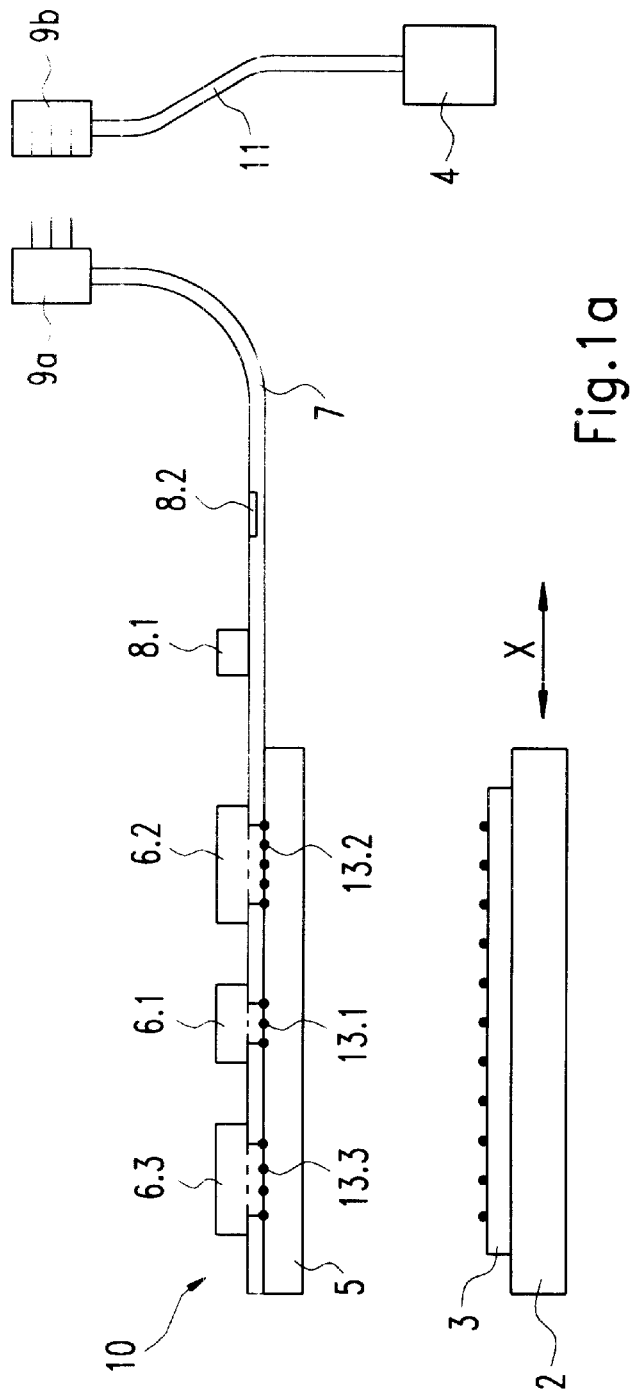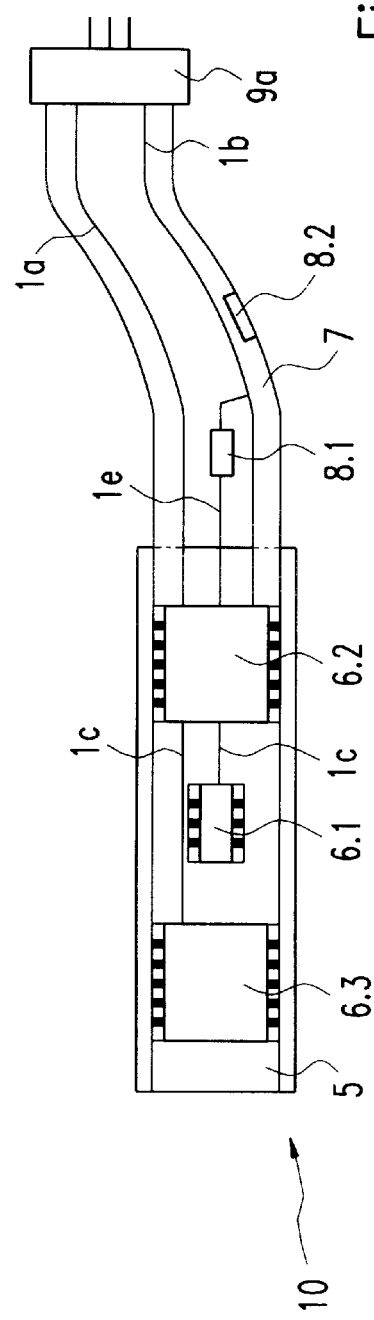

SCANNING UNIT WITH A PRINTED CIRCUIT FOR AN OPTICAL POSITION-MEASURING APPARATUS

BACKGROUND OF THE INVENTION

1. Field of the Invention

The present invention is directed to a scanning unit for a position-measuring apparatus, and more particularly, to a position-measuring apparatus that utilizes a flexible printed circuit to electrically couple elements which eliminates the need for bond wires.

2. Discussion of Relevant Art

In prior art optical position-measuring apparatuses, a scale having a graduation is scanned with a scanning unit for the generation of position-dependent signals. The scale graduation, in the case of a transmitted-light measuring apparatus, includes alternately disposed light-transmissive and light non-transmissive areas, for example. Furthermore, a radiation source is required that illuminates the scale graduation structure either by incident light or transmitted light. Using radiation-sensitive detector elements, shift-dependent modulated optical scanning signals are registered in the case of a relative movement of the scanning unit and scale graduation structure. In addition, customarily provided on the side of the scanning unit of a transmitted light type optical position-measuring apparatus is a scanning graduation that is also formed by a sequence of light-transmissive and light non-transmissive areas.

Traditional scanning units are relatively expensive to construct and manufacture. There have been efforts to construct components of an optical position-measuring apparatus more simply and compactly while still providing mechanical stability.

One solution is directed toward the integration of various components of the scanning unit, and, if necessary, the required evaluation electronics into a common carrier substrate. German Patent Publication DE 195 24 725 C1 discloses such an example. This proposed solution has disadvantages because expensive multi-layer systems must be produced for connecting the various components on the glass carrier substrate if conductor track crossovers are necessary.

Connecting problems of this type can be managed if flexible printed circuits are used for connecting various components within the scanning unit. These flexible printed circuits may also contain, already in more or less integrated form, various components of the scanning unit, and, if necessary, of the evaluation electronics. Scanning units with this type of flexible printed circuits are known from the following publications: European Patent Publication Nos. EP 0 328 661 A1 and EP 0 146 312; Japanese Patent Publication No. JP-57-207819 and U.S. Pat. No. 5,486,923, for example.

In each of the aforementioned publications, a flexible printed circuit is applied to a carrier component of a scanning unit and to this in turn several components such as light sources, evaluation components, or detector elements are applied. The various components are connected electrically to one another by the conductor tracks of the flexible printed circuit. The radiation-sensitive face of the detector elements is oriented oppositely to the flexible printed circuit in the variations that are known from each of these publications. This has the consequence that, in the case of connection of the detector elements from the radiation-sensitive side, so-called bond wires are required for the connection to the flexible printed circuit. This type of connection results in increased cost of manufacture, particularly for the production of a large number of parts.

In the scanning unit disclosed in Japanese Patent Publication No. JP-57-207819 the radiation-sensitive faces of the detector elements are also oriented away from the flexible printed circuit. Details regarding the connection of the detector elements are not disclosed.

U.S. Pat. No. 5,534,693 also discloses disposing on a scale graduation carrier an optoelectronic detector element by a flexible printed circuit for reference mark detection.

It is thus an object of the present invention to form advantageously a scanning unit with which a graduation structure of a scale for the generation of position-dependent output signals can be scanned. Ensured signal quality, reduced manufacturing costs should result particularly if the electrical connection points are as small as possible. Furthermore, it is desirable that the scanning unit have as compact and stable a mechanical construction as possible.

The present invention disposition of the flexible printed circuit and at least one of the detector elements within the scanning unit of an optical position-measuring apparatus has, moreover, in comparison to the prior art solutions, a clearly simpler manufacture as a consequence. Thus it is no longer required to connect electrically the detector elements to one another and/or to other structural elements by separately applied bond wires. Instead, the assembly of scanning units with the required detector elements results from the flexible printed circuit already connected with the detector elements in production. Moreover fewer electrical connection points results.

Furthermore, it has proven itself advantageous if, moreover, the function of the various components on the flexible printed circuit can already be tested before final mounting of the complete scanning unit and in this way defective units separated out.

Furthermore, in a preferred embodiment of the invention the scanning unit is not restricted to one definite scanning geometry but rather can be used in linear, rotary, incident-light, or transmitted-light measuring apparatuses, for example, as well as absolute and incremental position measuring apparatus.

Moreover it is ensured in this type of scanning unit, due to the small distance between the scanning graduation structure and the subsequently disposed optoelectronic components that a good optical separation with minimal crosstalk and low scattered light result.

In addition, the use of the flexible printed circuit, due to the relatively simple manageable prior out multi-layer technology, makes certain that any required conductor track crossovers can be realized simply, in particular, without expensive vacuum process technologies.

Furthermore, it follows as a further advantage that any mechanical stresses between the respective carrier bodies and the components disposed thereon due to the flexible printed circuit disposed therebetween can be minimized. Any possible thermal extension of the carrier body is transferred to the flexible printed circuit in this case, which compensates for this type of thermal effect.

Further advantages as well as the details of the inventive scanning unit follow from the following description of several exemplary embodiments with the aid of the accompanying figures.

BRIEF DESCRIPTION OF THE DRAWINGS

FIG. 1a is a schematic of a reflected-light position-measuring apparatus according to a first preferred embodiment of the present invention.

FIG. 1b is a plan view of the scanning unit shown in FIG. 1a.

FIG. 5 is an enlarged view of a portion of the scanning unit shown in FIG. 1a.

FIG. 7b is a cross-sectional view of the apparatus shown in FIG. 7a.

DETAILED DESCRIPTION OF THE PRESENTLY PREFERRED EMBODIMENTS

Figure 1C:
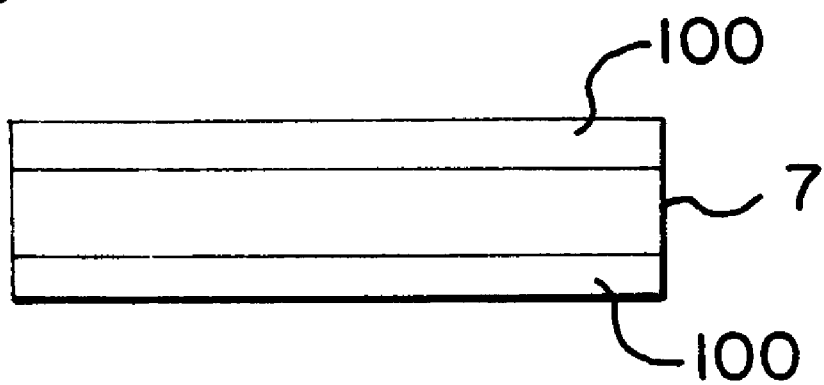
FIG. 1c is a side view of a portion of the printed circuit used with the scanning units shown in FIGS. 1a and 1b.

FIG. 1a is a schematic of a reflected-light position-measuring apparatus according to a preferred embodiment of the present invention. The optical position-measuring apparatus includes a scale 2, scanning unit 10 and evaluation unit 4. Scale 2 has a graduation 3 disposed thereon. The scale 2 and scanning unit 10 are moveable with respect to one another in the measuring direction X. For example, the scale 2 may be coupled to a workpiece (not shown) and the scanning unit 10 may be coupled to a tool (not shown) of a machine tool. The relative position of the tool to the workpiece is measured by the position-measuring apparatus.

In a preferred embodiment, the scanning unit 10 is housed in a housing (not shown) for protection against mechanical influences. The scanning unit 10 scans the scale 2 and generates scanning signals. These scanning signals are sent to the evaluation unit 4 where they can be processed. In a preferred embodiment, the evaluation unit 4 processes the scanning signals to generate control signals which are used to control the movement of the machine tool, for example, as is well known by those of ordinary skill in the art.

In a preferred embodiment shown in FIGS. 1a and b, an incremental reflected-light position-measuring apparatus is shown. The graduation 3 of the scale 2 includes a periodic sequence of reflecting and non-reflecting areas disposed on a scale 2 according to prior art practices. FIG. 1b is a plan view of the scanning unit 10 shown in FIG. 1a. The scanning unit 10 according to a preferred embodiment shown in FIGS. 1a and b includes a carrier body 5 that is transparent to the radiation used and preferably is a flat, plane glass substrate. A portion of a flexible printed circuit 7 is disposed on a surface of a carrier body 5. Carrier body 5 provides the mechanical stabilization of at least a portion of the flexible printed circuit 7.

The scanning unit 10 also includes a light source 6.1 and photodetectors 6.2 and 6.3. Other circuit components 8.1 and 8.2 can also be incorporated in the scanning unit 10 as will be described in detail hereinafter. The detectors 6.2 and 6.3 have radiation-sensitive faces that face towards the scale 2. A scanning graduation 13.2, 13.3 is disposed in front of the radiation-sensitive faces of the detectors 6.2, 6.3, respectively. A beam is emitted by the light source 6.1 and is reflected and, if necessary, deflected at the graduation 3 and arrives at detectors 6.2, 6.3. In a preferred embodiment detectors 6.2, 6.3 are optoelectronic detectors. The scanning graduations 13.2, 13.3 disposed before detectors 6.2, 6.3 allow position-dependent output signals to be generated in the case of relative movement of the scanning unit 10 and scale 2 as is well known by those of ordinary skill in the art. Thus, the scanning graduations 13.2,13.3 cause, in connection with a scanned graduation 3, the generation of a stripe pattern that can be converted, with the aid of the detector elements 6.2, 6.3 into periodic, position-dependent signals in the case of relative movement between the scale 2 and scanning unit 3.

Although the position-measuring apparatus is shown for a reflected-light type device it may also be used in transmitted-light type measuring apparatuses as well as for use within absolute measuring systems. Moreover, along with the illustrated linear measuring arrangement, rotary measuring arrangements with an appropriately structurally modified scanning unit and scale can obviously also be realized, as well as measuring arrangements, for example, in a cylindrical configuration.

The principal function of the flexible printed circuit 7 is to provide electrical connections between the various components 6.1, 6.2, 6.3, 8.1, 8.2 of the scanning unit 10 and the subsequently disposed evaluation unit 4. In a preferred embodiment, the connections between the various components 6.1, 6.2, 6.3, 8.1, 8.2 are provided by conductor tracks 1a–1e that are integrated into the flexible printed circuit 7 as shown in FIG. 1b.

The flexible printed circuit 7 used for that purpose is formed according to prior art practices, that is, electrical conductor tracks 1a–1e are disposed in definite line patterns on an electrically insulating, flexible carrier material that in turn are covered with a protective layer. Thereby various embodiments of this type of flexible printed circuit 7 can be used, for example multi-layer arrangements, single-sided or multi-sided variations, through-plated arrangements and so on. An appropriately thinly formed printed circuit board which due to its slight thickness still has a certain flexibility is also considered a flexible printed circuit.

Furthermore, the flexible printed circuit 7 in integrated form can contain already complete circuits 8.2 that are used as evaluation components for further processing the position-dependent modulated analog scanning signals. In the preferred embodiment shown, several of the components 6.1, 6.2, 6.3 are disposed in that part of the flexible printed circuit 7 that is stabilized by the carrier body while other components 8.1, 8.2 are integrated either directly into the flexible printed circuit 7 or are disposed on the part of the flexible printed circuit 7 that is not stabilized mechanically. The electrically conducting connection of the components 6.1, 6.2, 6.3, 8.1, 8.2 among themselves and/or with the evaluation unit 4 is accomplished by the conductor tracks 1a–1e indicated schematically in FIG. 1b within the flexible printed circuit 7.

The flexible printed circuit 7 has at one end which is to be coupled to the evaluation unit 4 a removable electrical connection element 9a in the form of a plug connector. In particular, the scanning unit 1 can be coupled to the evaluation unit 4 through a plug counterpart 9b and an appropriate cable 11. Additional components (not shown) for additional processing of the scanning signals such as interpolation or digitalization of the scanning signals can be disposed on the connector plug 9b and connected electrically by the flexible printed circuit.

In an area of the carrier body 5 it can prove advantageous to provide the flexible printed circuit 7 with an electrical shielding that shields at least part of the various components 6.1, 6.2, 6.3, 8.1, 8.2 with respect to electromagnetic interference radiation. Shielding, which is not shown in FIGS. 1a and 1b but is shown in FIG. 1c, in the form of a thin metal layer 100 applied to at least the upper and lower side of the flexible printed circuit 7 is suitable, for example. Alternatively, the flexible printed circuit 7 can be completely encircled with a shielding of this type.

Among the components 6.1, 6.2, 6.3, 8.1 and 8.2 of the scanning unit 10, at least one component is formed as an optoelectronic detector element that serves to generate modulated optical scanning signals in the case of relative shift of the scanning unit 10 and graduation 3. As detector elements 6.2, 6.3 any customary photoelements are suitable. Advantageously several detector elements 6.2, 6.3 are provided within the scanning unit 10 in order to generate defined phase-shifted signals according to prior art practices. In particular at the output of the detectors two scanning signals that are phase-offset by 90° are produced that, along with the determination of relative position, it is also possible to discriminate the direction of displacement. In the preferred embodiment shown, the scanning unit 10 includes two detector elements 6.2, 6.3. Preferably four detector elements interconnected according to prior art practices may be included.

Moreover, assigned to each of the detector elements 6.2, 6.3 is a schematically illustrated scanning graduation 13.2, 13.3 that is shown in the preferred embodiment of FIGS. 1a and 1b at the upper side of the carrier body 5. If the carrier body 5 is a glass substrate, the glass is textured or patterned in the area of the radiation-sensitive detector faces to form scanning graduations 13.2, 13.3. This can be realized in the form of periodically disposed light-transmissive or light-non-transmissive areas that function as scanning graduations 13.2, 13.3 according to prior art practices.

The radiation-sensitive detector faces of the detector elements 6.2, 6.3 are each consequently oriented, in the preferred embodiment shown in FIGS. 1a and 1b, in the direction of the flexible printed circuit 7 or in the direction of the transparent carrier body 5. Due to the relative arrangement of the carrier body 5, flexible printed circuit 7, and radiation-sensitive detector faces, the flexible printed circuit 7 in the preferred embodiment shown has a recess at least in a partial area of the respective detector face. Through this recess the radiation reflected back from the scale graduation 3 after passage through the scanning graduations 13.2, 13.3 can arrive at the radiation-sensitive detector faces.

In addition to the patterning shown for the upper side of the carrier body 5, there exist additional possibilities to form the scanning graduations 13.2, 13.3. For example, it is also possible to pattern the underside of the carrier body 5 or, to pattern the flexible printed circuit 7 in the area of the detector face recesses. Also, the radiation-sensitive detector face can be formed in a patterned way which serves as a scanning graduation.

Figure 5:
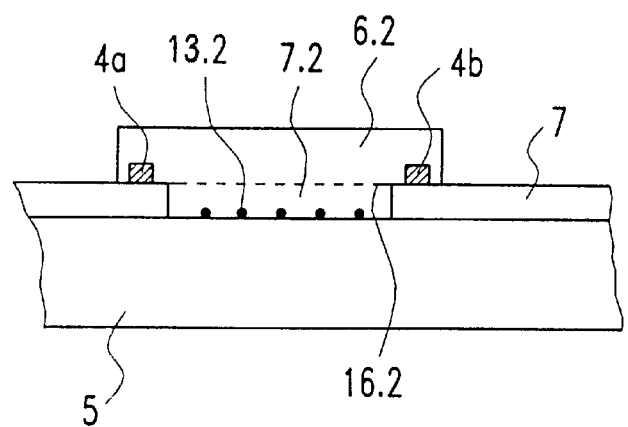

FIG. 5 is an enlarged view of a portion of the scanning unit shown in FIG. 1a, in particular, the scanning unit 10 having a detector element 6.2 disposed over the carrier body 5 and the flexible printed circuit 7. The detector element 6.2 shown is disposed above the flexible printed circuit 7 wherein the flexible printed circuit 7 has a recess 7.2. The radiation-sensitive face 16.2 of the detector element 6.2 is oriented in the direction of the flexible printed circuit 7 whereby the radiation-sensitive detector face 16.2 of the detector element 6.2 rests at least partially on the flexible printed circuit 7 in an area of overlap. The radiation-sensitive detector face 16.2 is consequently somewhat larger than the recess 7.2 of the flexible printed circuit 7. In the area of overlap between the detector face 16.2 and flexible printed circuit 7, the detector elements 6.2 are connected electrically to the flexible printed circuit 7 as indicated by contacts 4a and 4b. The connection of the detector element 6.2 is consequently done in this preferred embodiment only from the front side or radiation-sensitive face 16.2 of the detector element 6.2. There is no need for connection from the back side or from both front and back sides. Suitable connecting processes to couple the detector elements 6.2 as well as other of the components to the flexible printed circuit 7 are known as so-called flip-chip technology. Reference is made, by way of example, to Hans Kober's publication "Flexibel verdrahten auf kleinstem Raum" in [Flexible Interconnection in the Smallest Space] Feinwerktechnik, Mikrotechnik, Mikroelektronik [Precision Technology, Microtechnology, Microelectronics], Carl Hanser Verlag Munich, 104, P. 356–359 (1966).

From a production point of view this type of connection of the detector elements 6 on the flexible printed circuit 7 can be done rather simply in comparison to connections using bond wires as taught by the prior art. After assembly of the flexible printed circuit 7 with the various components according to this practice, the part of the flexible printed circuit 7 to be stabilized is glued to the glass carrier body 5.

Referring back to FIGS. 1a and b it is also possible to connect an integratedly formed radiation source 6.1 that in the preferred embodiment of the scanning unit 10 shown in FIGS. 1a and 1b is also disposed on the carrier body 5 using the same technique. The radiation source 6.1 is thereby formed perhaps as a semiconductor laser. In this case, that side of the radiation source 6.1 that emits radiation is turned toward the flexible printed circuit 7, that is, the connection is done frontally by prior art flip-chip technologies. In the preferred embodiment shown in FIGS. 1a and b it is preferred to structure the carrier body 5 on the transmission side before the radiation source 6.1 is located on the flexible circuit 7 so that this area functions as transmission graduation 13.1 for beam formation. This represents, however, merely one possible preferred embodiment of the radiation source. Alternatively, suitable optics can also be disposed between the radiation source and the scale graduation. In addition the flexible printed circuit 7 lying before the radiation source can be patterned. In addition, the light-emitting face of the radiation source 6.1 itself can be patterned.

Of course, the flexible printed circuit 7 also has a corresponding recess in the area before the radiation-emitting face of the radiation source 6.1 through which the emitting radiation arrives in the direction of the scale graduation 3.

Along with the components 6.1, 6.2 and 6.3 for the generation and detection of electromagnetic radiation is at least one component but preferably a couple of components 8.1, 8.2 disposed in the scanning unit 10 and electrically coupled to one another by the flexible printed circuit 7 that further process the signals output by detectors 6.1, 6.2; i.e., detected, shift-dependent modulated signals. Components 8.1, 8.2 may be amplifiers, digitizers, or interpolation units, for example. Furthermore, it is also possible to use components that correct the analog scanning signals with respect to phase position, amplitude, or offset and so on.

Figure 2:
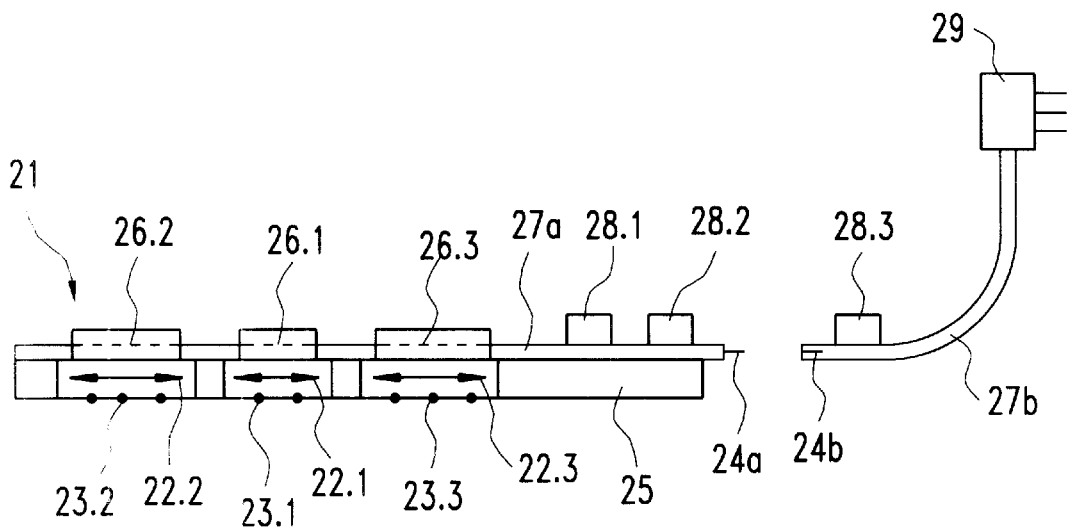
FIG. 2 is a schematic of a reflected-light position-measuring apparatus according to a second preferred embodiment of the present invention.

FIG. 2 is a schematic of a reflected-light position-measuring apparatus according to a second preferred embodiment of the present invention. A portion of a flexible printed circuit 27a is once again disposed and stabilized mechanically by a transparent carrier body 25. By the flexible printed circuit 27a, various components 26.1, 26.2, 26.3, 28.1, 28.2, 28.3 of a scanning unit 21 are coupled to one another electrically in this area 27a as well as in a nonstabilized area 27b. The partial area 27a of the flexible printed circuit 27 to be stabilized is once again disposed directly on the carrier body 25 and preferably glued to the carrier body 25. A radiation source 26.1 as well as two detector elements 26.2, 26.3 are disposed over the flexible printed circuit 27a. As was already described with references to FIGS. 1a and b, at least in a partial area of the radiation-sensitive faces of the detector elements 26.2, 26.3 and the radiation-emitting face of the radiation source 26.1 the flexible printed circuit 27a has recesses. The coupling of these components 26.1, 26.2, 26.3 is accomplished in the same manner previously described.

Scanning graduations 23.2, 23.3, as well as a transmission graduation 23.1 are moreover formed by patterning of the carrier body underside, that is, the alternatively light-transmissive or light-non-transmissive areas are disposed on the underside of the glass substrate serving as carrier body 25 instead of the top side as shown in FIGS. 1a and b.

In addition in this preferred embodiment of the scanning unit 21 individual partial areas 22.1, 22.2, 22.3 of the transparent carrier body 25 possess a light-refracting optical effect. In particular, in the partial areas of the carrier body 25, directly before the radiation source 26.1 as well as before the detector elements 26.2, 26.3, optical elements 23.1 23.2, 23.3 are integrated directly into the carrier body 25. For example, so-called GRIN lens are suited for this purpose. A GRIN lens 23.1 disposed before the radiation source 26.1 has a collimating optical effect while the GRIN lens 23.2, 23.3 before the detector elements 26.2, 26.3 each have a converging or focusing optical effect. For the production of these partial areas 22.1, 22.2, 22.3 to function as GRIN lenses exchange processes in the carrier body production can be used in an advantageous manner so that the complete glass substrate can be produced in one production process.

Alternatively, the partial areas 22.1, 22.2, 22.3 can be formed as a lens array or prisms that are integrated into the carrier body and have the required optical effect.

Furthermore, in this preferred embodiment a removable connector plug is provided between the part of the flexible printed circuit 27a stabilized by the carrier body 25 and the subsequent nonstabilized area 27b. For this purpose a suitable connector plug 24a as well as a matching plug counterpart 24b is required as shown.

Figure 3:
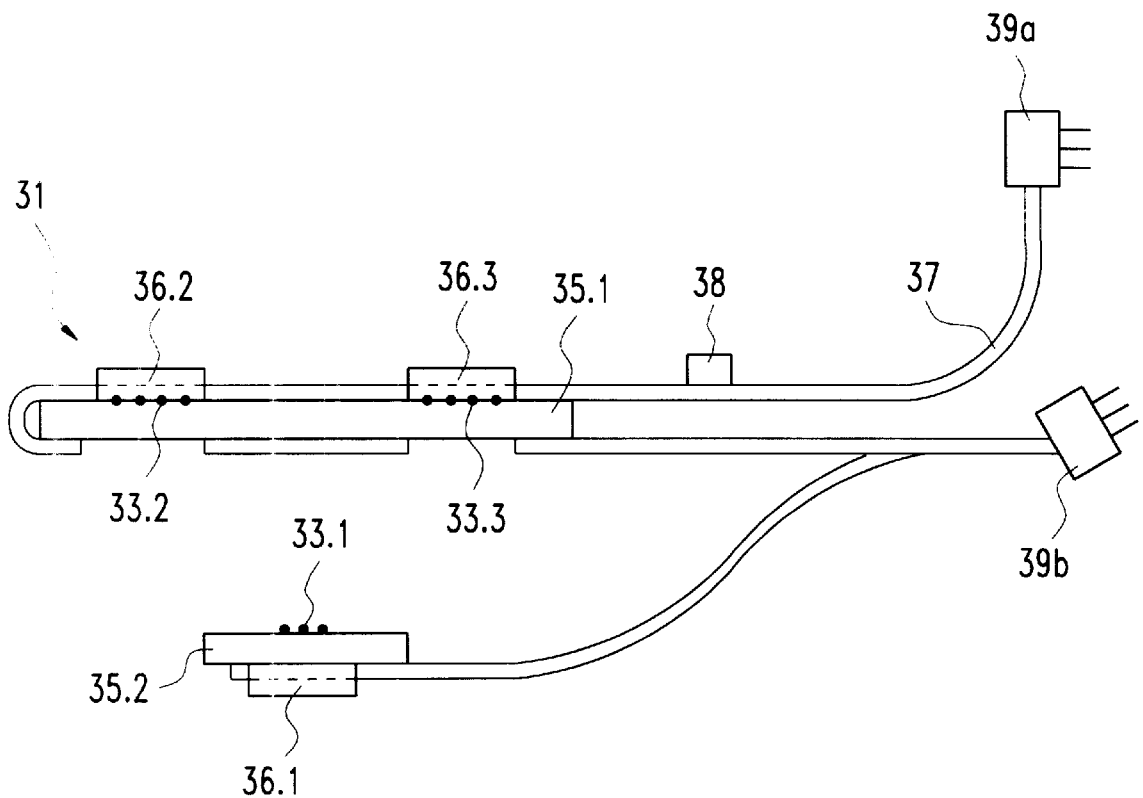
FIG. 3 is a schematic of a transmitted-light position-measuring apparatus according to a third preferred embodiment of the present invention.

FIG. 3 is a schematic of a transmitted-light position measuring apparatus according to a third preferred embodiment of the present invention. In this preferred embodiment of the scanning unit 31 includes on a detector-side part of the scanning unit shown in the upper half of the figure a transparently formed carrier body 35.1 on which two detector elements 36.2, 36.3 are disposed over a glued-on partial area of the flexible printed circuit 37 as previously explained. By a connector plug 39a, the detector-side part of the scanning unit 31 is removably connected to a subsequently disposed evaluation unit (not shown).

The scanning units 33.2, 33.3 before the radiation-sensitive detector faces are formed as in the first preferred embodiment shown in FIGS. 1a and 2, i.e., on the upper side of the carrier body. The portion of the flexible printed circuit 37 glued onto the upper side of the carrier body also has the corresponding recesses before the radiation-sensitive detector faces through which the beam can arrive at the detector elements 36.2, 36.3. With respect to the coupling of the detector elements 36.2, 36.3, as well as the evaluation components 38 provided in the nonstabilized partial area, reference is made to the previous embodiments.

The flexible printed circuit 37 disposed in this preferred embodiment of the scanning unit 31 on the detector-side part is partially wound about the carrier body 35 as shown. Preferably the flexible printed circuit 37 is glued to the underside of the carrier body. Due to this chosen geometry, additional recesses of the flexible printed circuit 37 are furthermore required on the underside of the carrier body 35 so that beams can arrive at the detector elements.

Alternatively instead of patterning the carrier upper side it is also possible in a preferred embodiment to pattern the flexible printed circuit 37 in the area of the recesses on the underside of the carrier body as shown in FIG. 3.

Due to the chosen transmitted-light measuring apparatus, the scanning unit 31 furthermore includes a radiation-source side part shown in the lower half of the figure that is disposed spatially separated from the detector-side part mentioned initially and together with the detector-side part of the scanning unit 31 is displaceable relative to a scale graduation (not shown) which is disposed between the radiation-source side part and the detector-side part. Also the radiation-source side part of the scanning unit 31 is coupled by flexible printed circuit 37 and a second connector plug 39b to the detector-side part of the scanning unit 31 and a subsequently disposed evaluation unit (not shown). The flexible printed circuit 37 includes in the preferred embodiment shown two removable plug connections 39a, 39b by which the coupling of the scanning unit to an evaluation unit and/or other system units such as, for example, to a power supply unit (not shown) is produced.

The radiation-source side part of the scanning unit 31 has a similar construction to the detector-side part, that is, a transparent carrier body 35.2 is also provided that mechanically stabilizes a portion of the flexible printed circuit 37 disposed thereon. Above a recess of the flexible printed circuit 37' a radiation source 36.1 is disposed that can be coupled as previously explained. On the side of the carrier body 35.2 facing the flexible printed circuit 37, a transmission graduation 33.1, preferably in the form of a patterning of the carrier body 35.2, is once again provided.

Figure 4:
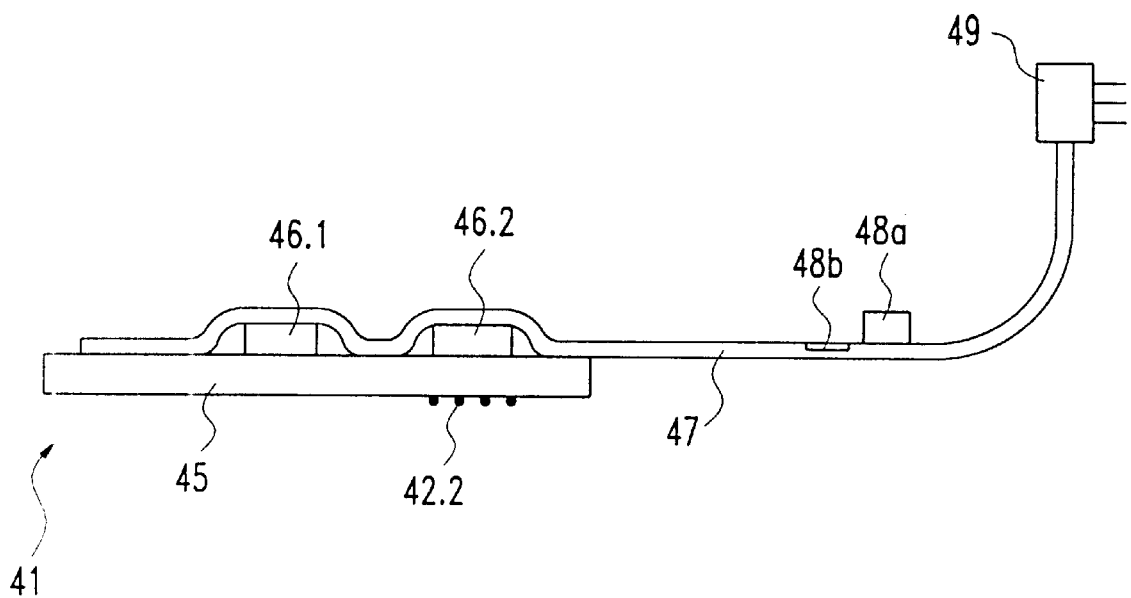
FIG. 4 is a schematic of a reflected-light position-measuring apparatus according to a fourth preferred embodiment of the present invention.

FIG. 4 is a schematic of a reflected-light position-measuring apparatus according to a fourth preferred embodiment of the present invention. Unlike the preferred embodiments previously described individual components 46.1, 46.2 of the scanning unit 41 are disposed directly on a transparent carrier body 45 while other evaluation components 48a, 48b are disposed on a nonstabilized part of the flexible printed circuit 47. Once again a removable connection to a subsequently disposed evaluation unit (not shown) is provided by a connector plug 49.

In the preferred embodiment of FIG. 4 one of the two components 46.1 disposed directly on the carrier body serves as a radiation source while the other of the two components 46.2 serves as a detector element that registers shift-dependent modulated signals of a reflectively formed scale graduation (not shown) disposed on the underside of the carrier body 45.

The preferred embodiment shown in FIG. 4 is suited particularly in connection with components that can be coupled from that side that is oriented away from the flexible printed circuit 47. For example, in this case one can use detector elements formed as photo elements that can be coupled from that side that is oriented away from the radiation-sensitive face, thereby providing back-side coupling.

Figure 6:
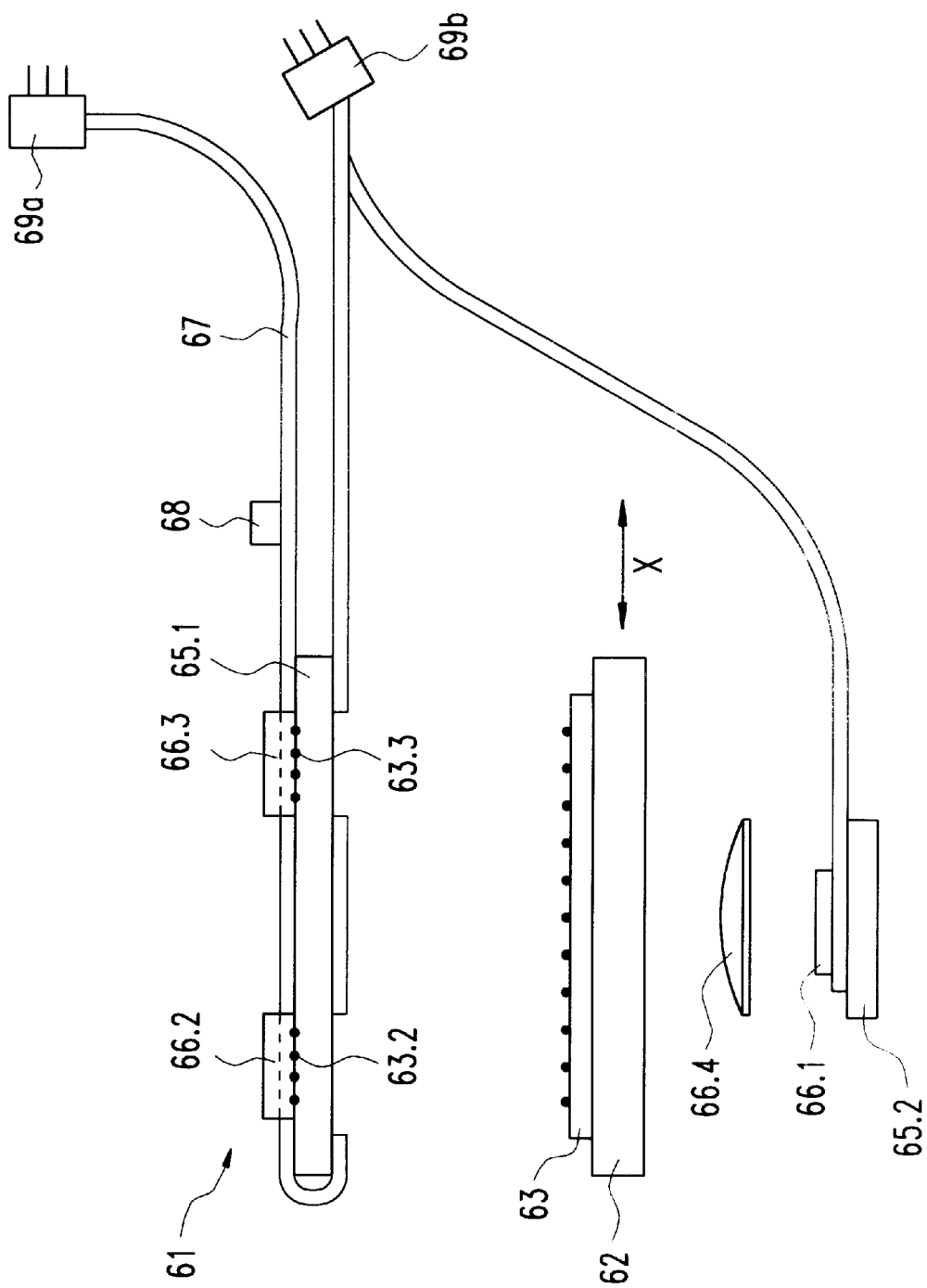
FIG. 6 is a transmitted-light position-measuring apparatus according to a fifth preferred embodiment of the present invention.

FIG. 6 is a transmitted-light position-measuring apparatus according to a fifth-preferred embodiment of the present invention. As in the case of the preferred embodiment shown in FIG. 3 a transmitted-light position-measuring apparatus is shown in which a transparent scale graduation 63 is disposed on a transparent graduation carrier 62. The graduation structure 63 is displaceable in a direction X with respect to the scanning unit 61.

While the detector-side part of the scanning unit 61 is formed identically to the preferred embodiment shown in FIG. 3, a modified construction of the radiation-source side of the scanning unit 61, that is, the lower side, is provided. Thus a radiation source 66.1 is disposed on a carrier body 65.2 over a flexible printed circuit 67 lying therebetween. The coupling of the radiation source 66.1, for example formed as a semiconductor laser or LED, is accomplished by the flexible printed circuit 67. Unlike the preferred embodiment shown in FIG. 3, collimating optics 66.4 are disposed before the radiation source 66.1 that serves to direct the emitted radiation collimated to the scale graduation structure 63. The collimation optics 66.4 are consequently fixedly connected to the scanning unit 61 and is also shifted with respect to the scale graduation structure 63.

Figure 7A:
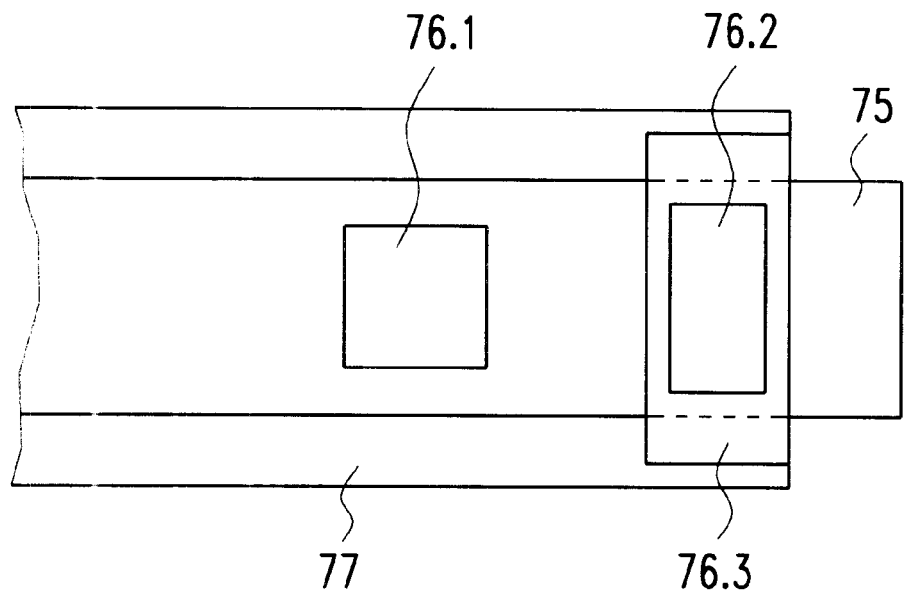
FIG. 7a is a plan view of a portion of a reflected-light position-measuring apparatus according to a sixth preferred embodiment of the present invention.
Figure 7B:
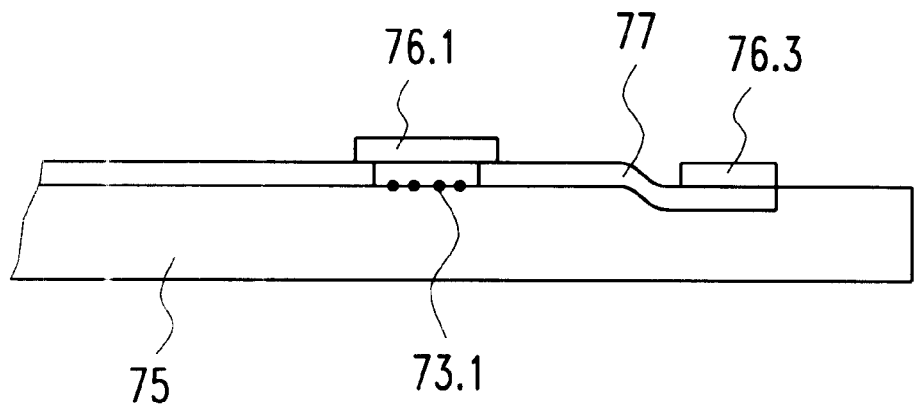

FIG. 7a is a plan view of a portion of a reflected-light position-measuring apparatus according to a sixth preferred embodiment of the present invention. FIG. 7b is a cross-sectional view of the apparatus shown in FIG. 7a. In this preferred embodiment so-called divergent illumination is provided within the position-measuring apparatus, that is, no collimation optics are required between a radiation source 76.1 and the scanning graduation structure 76.2. In this type of position-measuring apparatus it must moreover be ensured that the transmission graduation 73.1 before the light-emitting face of the radiation source 76.1, as well as the scanning graduation before the light-sensitive faces 76.2 of the detector element 76.3, lie in the same plane. In particular, in the case of a formation of the scanning graduation as a patterning of the light-sensitive face 76.2 of a detector element 76.3, definite prerequisites must be met in order to satisfy these conditions.

Thus in the preferred embodiments shown in FIGS. 7a and 7b, the radiation source 76.1 is arranged in the scanning unit as previously described. This means that it is disposed on a preferably transparent carrier body 75 and a flexible printed circuit 77 disposed thereon or above a corresponding recess of the same. The transmission graduation 73.1 is formed by the structuring of the carrier body 75. The radiation source can be disposed by the prior art flip-chip technology on the flexible printed circuit 77, as already described.

In order, moreover, to ensure that the scanning graduation in the form of a suitably patterned, light-sensitive face 76.2 of the detector element 76.3 lies in the same plane as the transmission graduation 73.1, the detector element 76.3 is disposed with its light-sensitive face directly on the carrier body 75. Laterally the suitably dimensioned detector element 76.3 projects over the transverse dimensions of the carrier body 75, which once again is required due to the coupling of the detector element 76.3 with the flexible printed circuit 77 on its underside. The flexible printed circuit 77 in this preferred embodiment is so wide that it makes possible coupling on its underside, at least in the area of the detector element 76.3. For this purpose the flexible printed circuit 77 is suitably bent in the coupling area and the detector element 76.3 can also once again be contacted at that side that faces the carrier body 75. In the area of the light-sensitive face 76.2 of the detector element 76.3, the flexible printed circuit 77 has also in this preferred embodiment once again a suitable recess.

Along with the preferred embodiments shown of the scanning unit there exist a series of additional possibilities. For example, it is also possible to dispose on both sides of the carrier body evaluation components in order to integrate a large number of evaluation components.

It is to be understood that the forms of the invention as described herein are to be taken as preferred examples and that various changes in the shape, size and arrangement of parts maybe resorted to without departing from the spirit of the invention or the scope of the claims.

What is claimed is:

1. An optical position measuring apparatus for generating position-dependent incremental signals, said optical position measuring apparatus comprising:
   a scale graduation;
   a scanning unit comprising:
      a carrier body;
      a flexible printed circuit having a recess, wherein said flexible printed circuit is arranged on said carrier body;
      at least one detector element arranged over said recess, the at least one detector element having a radiation-sensitive detector face that is oriented in the direction of said carrier body; and
      a scanning graduation having a plurality of opaque and light-transmitting areas, wherein said scanning graduation is arranged in the area of said recess so that interaction of light bundles coming from said scale graduation with said scanning graduation generates incremental signals that are detected by said at least one detector element.

2. An apparatus according to claim 1 further comprising at least one radiation source disposed on the flexible printed circuit, the at least one radiation source having a radiation-emitting face that is oriented in the direction of the flexible printed circuit wherein the flexible printed circuit has a second partially transparent recess in front of the radiation-emitting face.

3. An apparatus according to claim 1 further comprising a transparent carrier body that is at least partially coupled to the flexible printed circuit in a coupled region on which the detector element is disposed wherein the carrier body has a structure that mechanically stabilizes the flexible printed circuit in the coupled region.

4. An apparatus according to claim 2 further comprising a transparent carrier body that is at least partially coupled to the flexible printed circuit in a coupled region on which the detector element and the radiation source are disposed wherein the carrier body has a structure that mechanically stabilizes the flexible printed circuit in the coupled region.

5. An apparatus according to claim 3 wherein the transparent carrier body is graduated in the first partially transparent recess of the flexible printed circuit.

6. An apparatus according to claim 4 wherein the transparent carrier body is graduated in the first and second partially transparent recess of the flexible printed circuit.

7. An apparatus according to claim 1 wherein the radiation-sensitive detector face of the detector element is electrically coupled to the flexible printed circuit.

8. An apparatus according to claim 7 wherein the radiation-sensitive detector face of the detector element is electrically coupled to the flexible printed circuit in an area of overlap between the flexible printed circuit and the radiation-sensitive detector face.

9. An apparatus according to claim 5 wherein the graduated transparent carrier body comprises light-transmissive and light-non-transmissive areas.

10. An apparatus according to claim 1 further comprising a component disposed on the flexible printed circuit wherein the component processes scanning signals registered by the at least one detector element.

11. An apparatus according to claim 1 wherein the flexible printed circuit has at one end at least one electrical connection element for removable connection to a subsequently disposed evaluation unit.

12. An apparatus according to claim 3 wherein the flexible printed circuit has one or more additional components in an area that is not mechanically stabilized by the carrier body.

13. An apparatus according to claim 1 wherein the flexible printed circuit is provided with at least partially with electrical shielding.

14. An apparatus according to claim 3 wherein the carrier body comprises a square.

15. An apparatus according to claim 1 wherein the carrier body is coupled to the flexible printed circuit on at least two opposite sides of the carrier body.

16. An apparatus according to claim 1 wherein the flexible printed circuit has a removable electrical connection between the area mechanically stabilized by the carrier body and a subsequent nonstabilized area.

17. An apparatus according to claim 3 wherein the carrier body has several parts on which components are disposed that are connected electrically to one another by the flexible printed circuit.

18. An apparatus according to claim 3 wherein the scanning unit includes a radiation source that is disposed over a recess of the flexible printed circuit on a carrier body and the carrier body has a transmission graduation in the area of the recess while at least one detector element with its light-sensitive face disposed directly on the carrier body and, wherein the detector element contacts the flexible printed circuit at areas of the detector element projecting laterally over the carrier body.

19. An apparatus according to claim 3 wherein the carrier body comprises glass.

20. An apparatus according to claim 1 wherein a transmission-side and a detector-side part of the scanning unit are spatially separated and each include a flexible printed circuit as well as one or more components and both parts are connected to one another by the flexible printed circuit.

21. An apparatus according to claim 20 wherein the transmission-side or the detector-side part of the scanning unit include a transparent carrier body.

22. An apparatus according to claim 20 wherein the transparent carrier body is patterned.

23. An apparatus according to claim 3 wherein the carrier body has at least in partial areas a light-refracting optical effect.

24. An apparatus according to claim 23 wherein at least one optical element with converging or scattering optical effect is integrated into the carrier body.

25. An apparatus according to claim 24 wherein the optical element is formed as a GRIN lens.

26. A scanning unit according to claim 1 wherein the flexible printed circuit is graduated in the area of the recesses.

27. An optical position measuring apparatus for generating position-dependent incremental signals, said optical position measuring apparatus comprising:
   a scale graduation;
   a scanning unit comprising:
      a carrier body;
      a flexible printed circuit having a first recess and a second recess, wherein said flexible printed circuit is arranged on said carrier body;
      a light source arranged over said first recess;
      a first scanning graduation having a plurality of opaque and light-transmitting areas, wherein said first scanning graduation is arranged in the area of said first recess;
      at least one detector element arranged over said second recess, the at least one detector element having a radiation-sensitive detector face that is oriented in the direction of said carrier body; and
      a second scanning graduation having a plurality of opaque and light-transmitting areas, wherein said second scanning graduation is arranged in the area of said second recess so that interaction of light bundles coming from said scale graduation with said second scanning graduation generates incremental signals that are detected by said at least one detector element.

28. An apparatus according to claim 27 further comprising a transparent carrier body that is at least partially coupled to the flexible printed circuit in a coupled region on which the detector element and the radiation source are disposed wherein the carrier body has a structure that mechanically stabilizes the flexible printed circuit in the coupled region.

29. An apparatus according to claim 27 wherein said first scanning graduation and said second scanning graduations lie in a common plane.

30. An apparatus according to claim 28 wherein said first scanning graduation and said second scanning graduation lie in a common plane.

* * * * *

UNITED STATES PATENT AND TRADEMARK OFFICE
CERTIFICATE OF CORRECTION

PATENT NO. : 6,043,482
DATED : March 28, 2000
INVENTOR(S) : Rainer Hagl et al.

It is certified that error appears in the above-identified patent and that said Letters Patent is hereby corrected as shown below:

On the Title Page

In column 1, line 1, under "Foreign Application Priority Data" delete "196 50 832" and substitute --196 50 832.0-- in its place.

In the Claims

In claim 26, line 1, delete "A scanning unit" and substitute --An apparatus-- in its place.

Signed and Sealed this

Fifth Day of June, 2001

Attest:

Attesting Officer

NICHOLAS P. GODICI
*Acting Director of the United States Patent and Trademark Office*